(12) United States Patent
Chen et al.

(10) Patent No.: US 7,599,179 B2
(45) Date of Patent: Oct. 6, 2009

(54) MOUNTING APPARATUS FOR FAN

(75) Inventors: Yun-Lung Chen, Tu-Cheng (TW); Qing-Hao Wu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 442 days.

(21) Appl. No.: 11/309,147

(22) Filed: Jun. 28, 2006

(65) Prior Publication Data

US 2007/0146991 A1    Jun. 28, 2007

(30) Foreign Application Priority Data

Dec. 28, 2005    (CN)    ............... 2005 2 0121441 U

(51) Int. Cl.
*H05K 5/00*    (2006.01)
*H05K 7/00*    (2006.01)

(52) U.S. Cl. .............. 361/679.48; 361/694; 361/395

(58) Field of Classification Search .......... 361/687, 361/689, 690, 694, 695, 679.48
See application file for complete search history.

(56) References Cited

U.S. PATENT DOCUMENTS

| | | | | |
|---|---|---|---|---|
| 4,834,615 A | * | 5/1989 | Mauch et al. | 415/213.1 |
| 5,208,730 A | * | 5/1993 | Tracy | 361/687 |
| 5,788,566 A | * | 8/1998 | McAnally et al. | 454/184 |
| 5,906,475 A | * | 5/1999 | Melane et al. | 415/214.1 |
| 5,927,389 A | * | 7/1999 | Gonsalves et al. | 165/121 |
| 5,969,941 A | * | 10/1999 | Cho | 361/687 |
| 6,031,719 A | * | 2/2000 | Schmitt et al. | 361/695 |
| 6,213,819 B1 | * | 4/2001 | Fan | 439/894 |
| 6,215,659 B1 | * | 4/2001 | Chen | 361/695 |
| 6,244,953 B1 | * | 6/2001 | Dugan et al. | 454/184 |
| 6,351,380 B1 | * | 2/2002 | Curlee et al. | 361/695 |
| 6,373,698 B1 | * | 4/2002 | Christensen | 361/695 |
| 6,435,889 B1 | * | 8/2002 | Vinson et al. | 439/247 |
| 6,478,284 B2 | * | 11/2002 | Qiu | 248/680 |
| 6,493,225 B2 | * | 12/2002 | Chuang et al. | 361/695 |
| 6,497,273 B1 | * | 12/2002 | Horng et al. | 165/80.3 |
| 6,549,406 B1 | * | 4/2003 | Olesiewicz et al. | 361/695 |
| 6,556,437 B1 | * | 4/2003 | Hardin | 361/679.48 |
| 6,592,327 B2 | * | 7/2003 | Chen et al. | 415/213.1 |
| 6,604,916 B2 | * | 8/2003 | Lu et al. | 417/360 |
| 6,697,256 B1 | * | 2/2004 | Horng et al. | 361/704 |
| 6,722,971 B2 | * | 4/2004 | Gough | 454/187 |
| 6,826,048 B1 | * | 11/2004 | Dean et al. | 361/695 |
| 6,970,353 B2 | * | 11/2005 | Brovald et al. | 361/687 |
| 7,002,796 B2 | * | 2/2006 | Lao et al. | 361/695 |

(Continued)

*Primary Examiner*—Jayprakash N Gandhi
*Assistant Examiner*—Quinn Hunter
(74) *Attorney, Agent, or Firm*—Wei Te Chung

(57) ABSTRACT

A fan mounting assembly for securing a fan having a bottom wall, includes a computer chassis and a securing member. The computer chassis forms a first limiting member and a pair of second limiting members. The first limiting member is for restricting a horizontal and vertical movement of the fan. The second limiting members are respectively formed at opposite sides of the computer chassis, different to the first limiting member, for restricting lateral movement of the fan. The first limiting member and second limiting members together forms a housing for accommodating the fan. The securing member is resiliently attached to the computer chassis, for securing the fan in the housing.

8 Claims, 3 Drawing Sheets

U.S. PATENT DOCUMENTS

| | | | |
|---|---|---|---|
| 7,145,771 B2 * | 12/2006 | Wang | 361/695 |
| 7,230,826 B2 * | 6/2007 | Kyle et al. | 361/695 |
| 7,245,488 B2 * | 7/2007 | Chen | 361/695 |
| 7,301,768 B2 * | 11/2007 | Fan et al. | 361/695 |
| 7,349,211 B2 * | 3/2008 | Chen et al. | 361/695 |
| 7,385,813 B2 * | 6/2008 | Lin | 361/695 |
| 7,411,788 B2 * | 8/2008 | Liang | 361/695 |
| 2002/0060900 A1 * | 5/2002 | Qiu | 361/683 |
| 2003/0137806 A1 * | 7/2003 | Cannon | 361/695 |

* cited by examiner

MOUNTING APPARATUS FOR FAN

FIELD OF THE INVENTION

The present invention relates to a mounting apparatus, and more particularly to a fan mounting apparatus used in a computer.

DESCRIPTION OF RELATED ART

Electronic devices typically generate heat when operating due to the flow of electricity through electronic components housed within the device. Electronic components may be damaged if the heat is not removed. Generally, an electronic device uses a fan to produce an airflow for cooling the electronic components. Conventionally, the fan is mounted in the electronic device by a plurality of screws passing through corresponding holes of the fan. It is difficult and time-consuming to replace or remove the fan for repair, especially in some electronic systems, such as servers, where a mass of heat is produced from a plurality of electronic components. Therefore, a plurality of fans may be provided to increase speed of airflow for cooling the components. In which case many more screws are needed to mount the fans to the electronic device, making the replacement and removal process more difficult.

Accordingly, what is needed is a mounting apparatus for fans easily attached and removed from within the electronic device.

SUMMARY OF THE INVENTION

A fan mounting assembly for securing a fan having a bottom wall, includes a computer chassis and a securing member. The computer chassis forms a first limiting member and a pair of second limiting members. The first limiting member is for restricting horizontal and vertical movement of the fan. The second limiting members are respectively formed at opposite sides of the computer chassis, different to the first limiting member, for restricting lateral movement of the fan. The first limiting member and second limiting members together form a housing for accommodating the fan. The securing member is resiliently attached to the computer chassis, for securing the fan in the housing.

Other advantages and novel features of the present invention will be drawn from the following detailed description of preferred embodiment with attached drawings, in which:

DETAILED DESCRIPTION OF THE INVENTION

Figure 1:
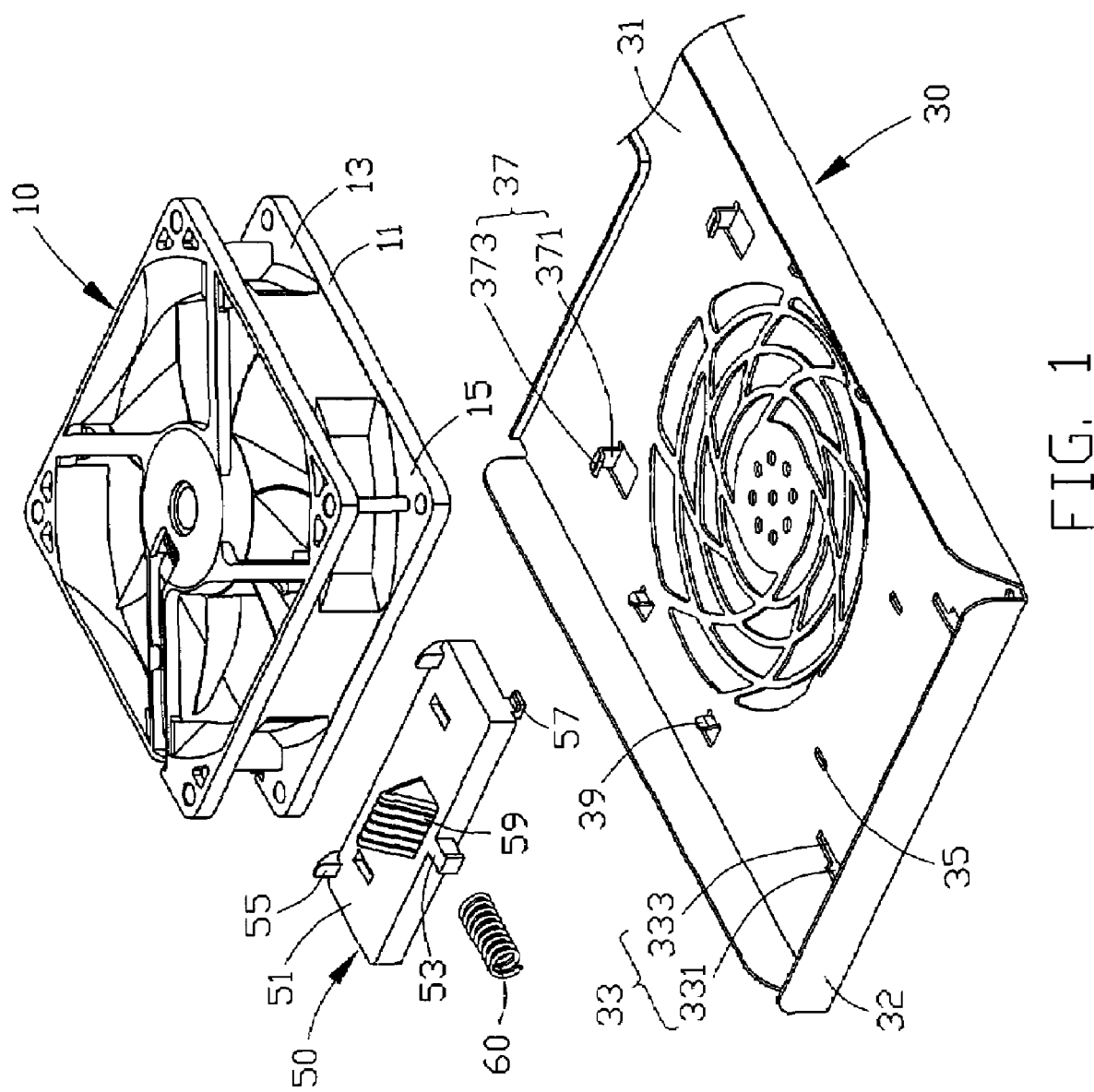
FIG. 1 is an exploded isometric view of the preferred embodiment of a mounting apparatus for a fan, including a securing member and a part of a computer chassis.

Referring to FIG. 1, an apparatus for mounting a fan 10 in a computer or other electronic device includes a computer chassis 30 and a securing member 50 for securing the fan 10 to the computer chassis 30.

The configuration of the fan 10 is familiar to the industry. The fan 10 includes four H-shaped side walls and a bottom wall 11 for coupling to the computer chassis 30. The bottom wall 11 includes a front top surface 13 and a back top surface 15.

The computer chassis 30 includes a base plate 31 and a side flange 32 perpendicular to the base plate 31. A pair of L-shaped mounting slots 33 is defined in an end of the base plate 31 adjacent the side flange 32. Each slot 33 includes a wide portion 331 and a narrow portion 333 communicating with the wide portion 331. A pair of guiding slots 35 is also defined in the end of the base plate 31 near the slots 33. A pair of first limiting members 37 opposite to the side flange 32 is stamped up from the base plate 31. Each limiting member 37 includes a first blocking tab 371 vertical to the base plate 31 and a second blocking tab 373 horizontal to the base plate 31 extending from a top edge of the first blocking tab 371. A pair of second limiting members 39 respectively protrudes from other opposite sides of the base plate 31. A declining guiding surface forms at a top portion of each of the second limiting members 39. The second limiting members 39 together with the first limiting members 37 form a housing for accommodating the fan 10.

Figure 2:
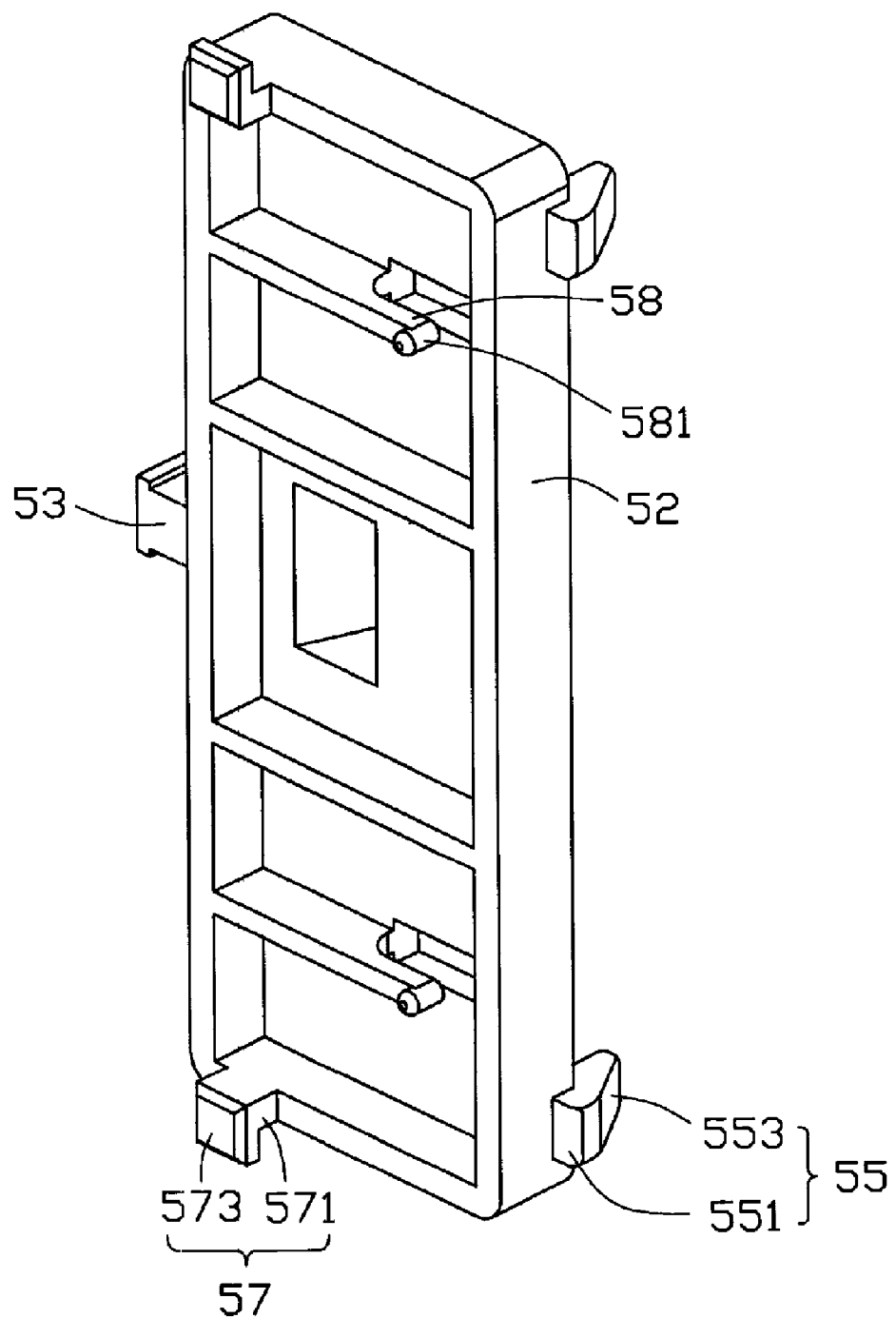
FIG. 2 is an enlarged view of the securing member of FIG. 1, but viewed from another aspect.

Referring also to FIG. 2, the securing member 50 includes a rectangular base 51. A post 53 protrudes back from a middle of a long side edge of the base 51. A pair of blocking protrusions 55 extends up and out from an opposite long side edge 52 of the base 51. Each blocking protrusion 55 includes a blocking surface 551 formed at a bottom thereof and a guiding surface 553 formed at a top thereof. A pair of securing tabs 57 respectively extends down from ends of short side edges of the base 51 adjacent the post 53. Each securing tab 57 includes a sliding portion 571 extending down from a bottom edge of the base 51 and a securing portion 573 extending out and perpendicular to the sliding portion 571. An operating handle 59 protrudes from a middle portion of a top surface of the base 51. The base 51 has a hollow body. A bottom surface of the hollow body forms a pair of cantilevers 58. A positioning post 581 protrudes down from a free end of each of the cantilevers 58 corresponding to the slots 35 of the base plate 31.

Figure 3:
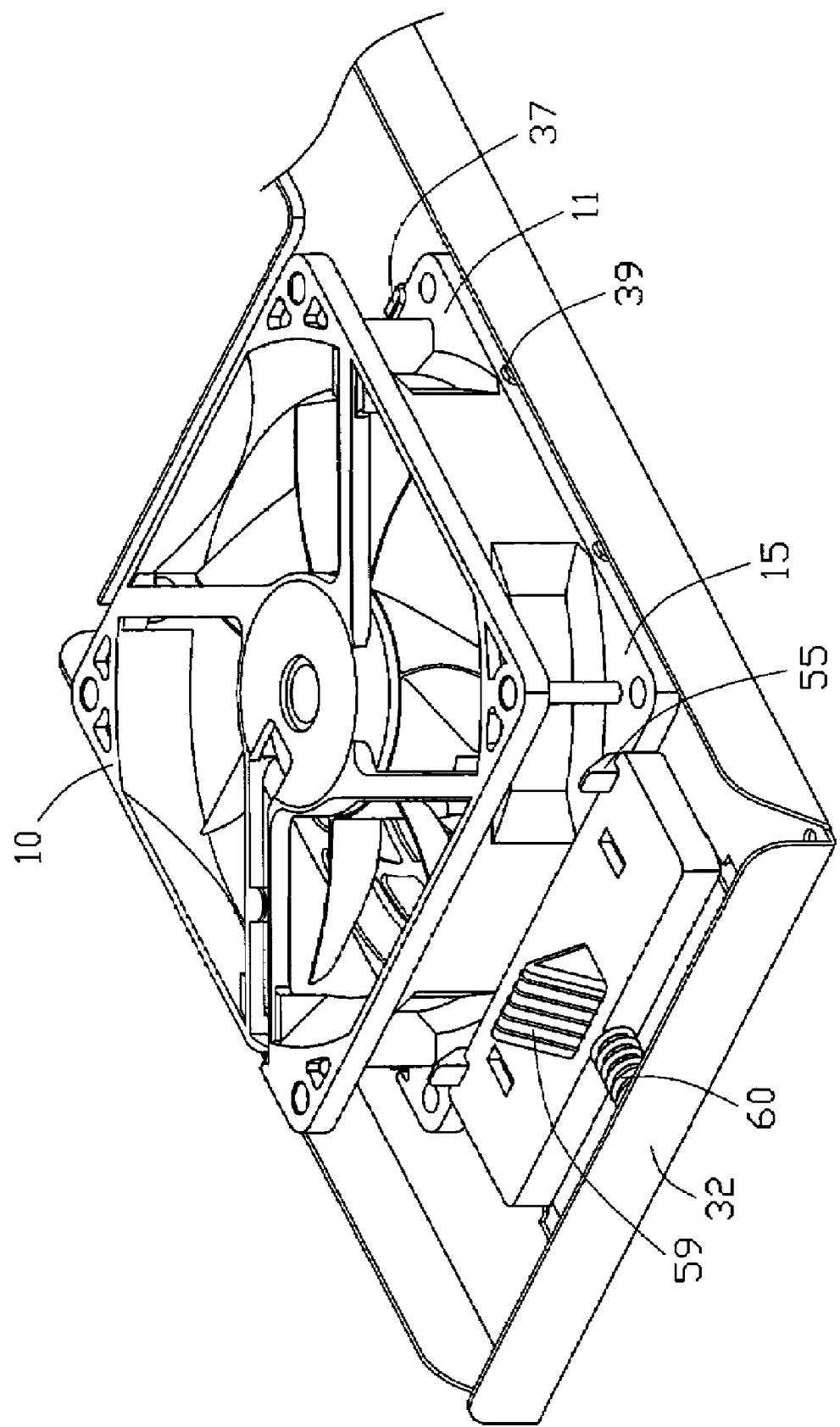
FIG. 3 is an assembled view of the mounting apparatus of FIG. 1.

Referring also to FIG. 3, an end of a spring 60 is fit over the post 53 of the securing member 50. Another end of the spring 60 is abuts against the side flange 32 of the computer chassis 30. As the spring 60 is compressed, the securing portions 573 of the securing tabs 57 are aligned with the wide portions 331 of the mounting slots 33 in the base plate 31 and inserted therein. When the spring 60 is released, the sliding portions 571 of the securing members 50 are urged to slide into the narrow portions 333 of the mounting slots 33 respectively. And the securing portion 573 is blocked by the base plate 31 of the computer chassis 30 from moving upward, for limiting a vertical movement relative to the base plate 31. The positioning posts 581 of the cantilevers 58 are deflected up and slide on the base plate 31. When the positioning posts 581 are respectively in alignment with the guiding slots 35 in the base plate 31, the positioning posts 581 rebound back and protrude through the guiding slots 35. Then, the positioning posts 581 further slide along the guiding slots 35. The length of the guiding slots 35 is less than that of the narrow portions 333 of the mounting slots 33. When the operating handle 59 of the securing member 50 is pulled toward the side flange 32 of the chassis 30, the positioning posts 581 of the securing member 50 slide in the guiding slot 35, and are respectively stopped by a furthest inner terminal of the guiding slot 35, for preventing the securing member 50 from further moving toward the side flange 32 of the computer chassis 30 and disengaging from the mounting slots 33. Thus, the securing member 50 is resiliently and slidably attached to the computer chassis 30 and in an initial state. The distance between the securing member 50 and the first blocking tab 371 of the first limiting member 37 is smaller than the length of the fan 10.

In assembly, the bottom wall 11 of the fan 10 is inserted between the first limiting members 37 and the securing member 50, along the second limiting members 39. A front edge of the bottom wall 11 is blocked by the first blocking tab 371, for limiting a movement of the fan 10 away from the side flange 32 of the computer chassis. A front top surface 13 of the bottom wall 11 is blocked by the second blocking tab 373, for limiting a vertical movement of the fan 10 relative to the base plate 31. Other side edges of the bottom wall 11 are blocked by the second limiting tabs 39, for restricting a lateral movement of the fan 10. A back edge of the bottom wall 11 abuts against the blocking protrusion 55. Pressing the fan 10 down along the guiding surface 553 of the blocking protrusion 55, the securing member 50 is urged to slide toward the side flange 32. The spring 60 is retracted. When the back edge of the bottom wall 11 is pressed under the blocking surface 551 of the blocking protrusion 55, the securing member 50 rebounds toward the fan 10. The back edge of the bottom wall 11 is blocked by the long side edge 52 of the securing member 50, for restricting a movement of the fan toward the side flange 32 of the computer chassis 30. The back top surface 15 of the bottom wall 11 is depressed by the blocking surface 551 of the blocking protrusion 55, for limiting a movement of the fan 10 vertical to the base plate 31. Thus, the fan 10 is secured on the base plate 31 of the computer chassis 10.

In disassembly, the operating handle 59 of the securing member 50 is urged toward the side flange 32, providing room for the fan 10 to move. The blocking protrusions 55 of the securing member 50 disengage with the bottom wall 11 of the fan 10. Removing the fan 10 from the second blocking tab 373 of the first limiting member 37. Then, the fan 10 is removed from the receiving housing.

It is to be understood, however, that even though numerous characteristics and advantages have been set forth in the foregoing description of preferred embodiments, together with details of the structure and function, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device comprising:
   a chassis of said electronic device enclosing said electronic device, and comprising a base plate extending along a side of said electronic device, said base plate comprising at least one first limiting member and at least one second limiting member extending away from said base plate respectively to commonly define a space between said at least one first limiting member and said at least one second limiting member beside said base plate;
   a fan of said electronic device functioning to cool said electronic device, and removably attachable to said base plate to be located in said space and air-communicable with an outside of said electronic device through said base plate, said fan being confined in said space by said at least one first limiting member and said at least one second limiting member respectively to block movement of said fan along a first type of directions parallel to said base plate, and being confined in said space by said at least one first limiting member exclusively to block another movement of said fan along a second type of directions perpendicular to said base plate; and
   a securing member removably attachable to said base plate beside said space, and restorably movable between a first position thereof where said securing member engages with said fan to block both said movement of said fan along said first type of directions and said another movement of said fan along said second type of directions, and a second position thereof where said securing member disengages from said fan to allow both said movement of said fan and said another movement of said fan;
   wherein a blocking protrusion integrally extends from said securing member; the blocking protrusion abuts on said fan for blocking both said movement of said fan along said first type of directions when said securing member is in said first position, and is removed away from said fan when said securing member is in said second position.

2. The electronic device as described in claim 1, wherein said securing member moves parallel to said base plate from said first position thereof to said second position thereof.

3. The electronic device as described in claim 1, wherein said computer chassis further comprises a side flange perpendicular to said base plate; said securing member is attached on said base plate between said side flange and said at least one first and second limiting members.

4. The electronic device as described in claim 3, wherein a post protrudes from said securing member toward said side flange of said computer chassis; said spring is secured on said post.

5. The electronic device as described in claim 1, wherein said blocking protrusion comprises a blocking surface formed at a bottom thereof for abutting on said fan, and a declining guiding surface formed at a top of said blocking protrusion.

6. The electronic device as described in claim 1, wherein a post protrudes from said securing member; a guiding slot is defined in said base plate of said computer chassis for slidably receiving said positioning post.

7. The electronic device as described in claim 1, wherein a pair of securing tabs extends down from said securing member; and a pair of mounting slots is defined in said base plate of said chassis for sliding receiving said securing tabs.

8. The electronic device as described in claim 7, wherein said securing tab comprises a sliding portion and a securing portion perpendicular to said sliding portion; said mounting slot comprises a wide portion for said securing portion extending therethrough, and a narrow portion for said sliding portion sliding therein and preventing said securing portion from disengaging therefrom.

* * * * *

UNITED STATES PATENT AND TRADEMARK OFFICE
CERTIFICATE OF CORRECTION

PATENT NO. : 7,599,179 B2  Page 1 of 1
APPLICATION NO. : 11/309147
DATED : October 6, 2009
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 542 days.

Signed and Sealed this

Twenty-eighth Day of September, 2010

David J. Kappos
*Director of the United States Patent and Trademark Office*